United States Patent
Goel

(10) Patent No.: US 7,619,916 B2
(45) Date of Patent: Nov. 17, 2009

(54) 8-T SRAM CELL CIRCUIT, SYSTEM AND METHOD FOR LOW LEAKAGE CURRENT

(75) Inventor: Ankur Goel, Haryana (IN)

(73) Assignee: STMicroelectronics Pvt. Ltd., Greater Noida, Uttar Pradesh (IN)

( * ) Notice: Subject to any disclaimer, the term of this patent is extended or adjusted under 35 U.S.C. 154(b) by 0 days.

(21) Appl. No.: 11/825,648

(22) Filed: Jul. 6, 2007

(65) Prior Publication Data

US 2008/0151605 A1    Jun. 26, 2008

(30) Foreign Application Priority Data

Jul. 6, 2006    (IN)    .................. 1592/DEL/2006

(51) Int. Cl.
    *G11C 11/00*    (2006.01)
(52) U.S. Cl. .................. 365/156; 365/154; 365/63; 365/72; 365/188
(58) Field of Classification Search .................. 365/154, 365/156, 63, 72, 188
    See application file for complete search history.

(56) References Cited

U.S. PATENT DOCUMENTS

| | | | |
|---|---|---|---|
| 5,770,892 A * | 6/1998 | Chan et al. .................. | 257/393 |
| 5,949,720 A * | 9/1999 | Brady .................. | 365/189.06 |
| 6,297,674 B1 * | 10/2001 | Kono et al. .................. | 327/108 |
| 6,334,909 B1 * | 1/2002 | Okamura et al. ............ | 148/303 |
| 6,341,083 B1 * | 1/2002 | Wong .................. | 365/154 |
| 6,556,487 B1 * | 4/2003 | Ratnakumar et al. ... | 365/185.08 |
| 7,092,307 B2 * | 8/2006 | Chen et al. .................. | 365/226 |
| 7,110,317 B2 * | 9/2006 | Song et al. .................. | 365/226 |
| 7,235,997 B2 | 6/2007 | Huang | |
| 7,259,986 B2 * | 8/2007 | Bhavnagarwala et al. .................. | 365/185.02 |
| 7,542,329 B2 * | 6/2009 | Cheng et al. ................. | 365/154 |
| 2007/0189102 A1 * | 8/2007 | Lin et al. ............... | 365/230.06 |

OTHER PUBLICATIONS

A. Goel, "Leakage Currents and Their Suppression in Deep Sub-Micron CMOS Circuits" (Jul. 2004) Thesis, Department of Electrical Engineering, Indian Institute of Technology, Kanpur - Best Available Copy (missing pp. 57, 94-96).

* cited by examiner

*Primary Examiner*—Viet Q Nguyen
(74) *Attorney, Agent, or Firm*—Lisa K. Jorgenson; Paul F. Rusyn; Graybeal Jackson LLP

(57) ABSTRACT

An SRAM cell has reduced gate and sub-threshold leakage currents. The SRAM cell is designed to include eight operatively coupled transistors to reduce leakage currents irrespective of data stored in the SRAM cell. The transistors lower the effective supply voltage at different nodes, when either bit '0' or '1' is stored in the SRAM cell. The reduced effective supply voltage is passed to other coupled transistors for minimizing leakages. The SRAM cell operates in an active mode and dissipates no dynamic power during active mode to inactive mode transition and vice-versa operations. The SRAM cell is also capable of reducing bit line leakage currents under suitable conditions.

12 Claims, 5 Drawing Sheets

8-T SRAM CELL CIRCUIT, SYSTEM AND METHOD FOR LOW LEAKAGE CURRENT

PRIORITY CLAIM

This application claims priority from Indian patent application No. 1592/Del/2006, filed Jul. 6, 2006, which is incorporated herein by reference.

TECHNICAL FIELD

Embodiments of the present invention relate to semiconductor memory devices, and more particularly to an eight transistor (8-T) static random access memory (SRAM) cell that is suitable for reducing leakage currents irrespective of data stored in the SRAM cell.

BACKGROUND

Semiconductor memory devices have undergone various design changes in terms of package density, operating speed, or power/current dissipation. Many devices, such as microprocessors, or other related devices include onboard memory, which contains one or more SRAM cells for data storage. The SRAM cells are more popular than dynamic-random-access-memory (DRAM) cells, as the SRAM cells operate at a higher speed with indefinite data storage capabilities, unlike the DRAM cells, which must be periodically refreshed. The SRAM memory is vastly employed in various telecommunication devices and networking devices, in workstations and high performance PCs, in advanced modems and complex military/industrial applications.

The amount of read current provided by an SRAM cell is decreased when the size of the SRAM cell is decreased. In particular, the read current is decreased with a decrease in a supply voltage due to new advancements. In contrast, the relative magnitude of the leakage current increases with decreased read current. With an increased leakage current, the reading of data from the SRAM cell becomes more difficult. The increased sub-threshold leakage and gate leakage current not only increase the integrated circuit (IC) reliability issues, but also increase the package cost in order to handle the excess power dissipation. The Metal Oxide Semiconductor (MOS) transistors used in the SRAM cells can be subjected to dielectric damage and reliability problems due to an excessive voltage developed across the gate oxide.

Various conventional techniques, such as gated Vdd cache, diode footed cache, dual Vt cells, etc. have been employed for reducing the leakage currents. Most of the conventional techniques either change substrate-bias equations to change the threshold voltage of a transistor, or lower the effective supply voltage to the SRAM cell during the inactive mode. The conventional techniques involve large dynamic power dissipation, when the SRAM cell moves from an inactive state to an active state or vice-versa. Also, the conventional techniques save the leakage current only when the SRAM cell is in the inactive mode. Moreover, a conventional SRAM cell takes significant time to move from the inactive mode to the active mode or vice-versa, hence there is a huge penalty of time.

FIG. 1A illustrates a conventional 6-T SRAM cell for reducing leakage current. The interconnectivity of different NMOS and PMOS transistor is shown in the circuit diagram. The MOS transistor MP1, MN2, and MN3 dissipates significant sub-threshold leakage because of a drain induced barrier lowering effect (DIBL). The sub-threshold leakage through transistor MN2 is highest. The transistor MN2, MN4, and MN3 dissipates gate leakage due to edge tunneling, while the transistor MN1 dissipates gate leakage due to on direct tunneling, and hence the transistor MN1 dissipates maximum gate leakage. The gate leakage through any of the PMOS transistor is small due to their P-type nature (higher barrier height in a PMOS as compared to that in an NMOS transistor).

FIG. 1B illustrates a 7-T SRAM cell (100) for reducing leakage current. The 7-T SRAM cell (100) is an extension of a conventional 6-T SRAM cell (described in FIG. 1A) in which an extra transistor (106) is inserted to form the 7-T SRAM cell (100). The extra transistor (106) is operatively coupled to provide low leakage currents when a bit '0 is stored in the 7-T SRAM cell (100). The extra transistor (106) lowers the effective supply voltage to minimize the leakages in the cell. The SRAM cell (100) receives the input voltage signal Vdd, and is connected to a bit line (BL)/complementary bit line (/BL), and a word line (WL) for read, write or erase operations. A bit '0' is stored at node A and bit '1' is stored at node B. The gate voltage of the extra transistor (106) (shown as Vc) is kept at the input voltage signal Vdd. The extra transistor (106) will pass this gate voltage as Vdd-Vth to node C (Vth is the threshold voltage of the extra transistor 106). The node C is connected to the pass transistor (112). The gate voltage of the transistor (110) thus reduces to Vdd-Vth, which strongly suppress the gate leakage through the transistor (110). The reduced leakage currents are marked by dotted lines. The 7-T SRAM cell (100) reduces the leakage currents only when bit '0' is stored in the cell. However, when bit '1' is stored in the cell, there is no leakage benefit and the extra transistor (106) even dissipates some extra leakage current. The 7-T SRAM cell (100) exploits the fact that the SRAM cell stores '0' for roughly 70% of the times and stores '1' for the rest. Hence, a new SRAM cell is required, which can suppress leakages, when either bit '0' or '1' is stored in the SRAM cell.

There arises a need for an SRAM cell suitable for reducing leakage currents irrespective of the data stored in the SRAM cell. Moreover, the SRAM cell operates in active mode and thus there are no transition delays and dynamic power dissipation during transition (active mode to inactive-mode and vice-versa) operations as are there in most of the conventional techniques.

SUMMARY

Embodiments of the present invention provide an SRAM cell for reducing gate and sub-threshold leakage currents in the SRAM cell irrespective of data stored in the SRAM cell.

Embodiments of the present invention provide an SRAM cell operating in an active mode and to prevent the transition delays and dynamic power dissipation during transition (active mode to inactive-mode and vice-versa) operations as are there in most of the conventional techniques.

An embodiment of the present invention provides an SRAM cell for reducing leakage current that include a first PMOS transistor having a source connected to a power supply voltage, a gate connected to a first control signal, and a drain connected to a virtual power supply voltage. A second PMOS transistor has a source connected to the power supply voltage, a gate connected to the virtual power supply voltage and a drain connected to the first control signal. A first inserted NMOS transistor has a source connected to the first control signal, a gate connected to a second control signal, and a drain connected to the virtual power supply voltage. A third NMOS transistor has a source and a gate connected to the power supply voltage and a drain connected to the virtual power supply voltage. A first NMOS transistor has a source connected to the virtual power supply voltage, a gate connected to the virtual power supply voltage, and a drain connected to a ground voltage. A second NMOS transistor has a source and a gate connected to the virtual power supply voltage, and a drain connected to the ground voltage. A fourth NMOS transistor has a source connected to the virtual power supply voltage, a drain and a gate connected to the power supply voltage. A second inserted NMOS transistor has a source and a drain connected to the virtual power supply voltage, and a gate connected to the second control signal such that, when the SRAM cell stores bit '1', the second inserted NMOS transistor is operatively coupled to provide low leakage currents and when the SRAM cell stores bit '0', the first inserted NMOS transistor is operatively coupled to provide low leakage currents.

The virtual power supply voltage Vdd-Vth of the SRAM cell is a voltage level obtained by lowering a power supply voltage Vdd by a threshold voltage Vth of a transistor. The first control signal and the second control signal are activated, when the SRAM cell operates in an active mode. The second control signal is a power supply voltage Vdd. The bit line and the complementary bit line are charged at a power supply voltage Vdd for reducing the gate and sub-threshold leakage currents. The bit line and the complementary bit line can also be precharged to the virtual power supply voltage Vdd-Vth for reducing bit-line leakage currents.

Another embodiment of the present invention provides an SRAM array for providing low leakage current that includes a plurality of SRAM cells. Each of the SRAM cell in a row is connected to a word line. SRAM cells in a column are connected to a bit line, a complementary bit line, a power supply voltage, and a ground voltage. Each of the SRAM cell includes a first PMOS transistor having a source connected to a power supply voltage, a gate connected to a first control signal, and a drain connected to a virtual power supply voltage. A second PMOS transistor has a source connected to the power supply voltage, a gate connected to the virtual power supply voltage and a drain connected to the first control signal. A first inserted NMOS transistor has a source connected to the first control signal, a gate connected to a second control signal, and a drain connected to the virtual power supply voltage. A third NMOS transistor has a source and a gate connected to the power supply voltage and a drain connected to the virtual power supply voltage. A first NMOS transistor has a source connected to the virtual power supply voltage, a gate connected to the virtual power supply voltage, and a drain connected to a ground voltage. A second NMOS transistor has a source and a gate connected to the virtual power supply voltage, and a drain connected to the ground voltage. A fourth NMOS transistor has a source connected to the virtual power supply voltage, a drain and a gate connected to the power supply voltage. A second inserted NMOS transistor has a source and a drain connected to the virtual power supply voltage, and a gate connected to the second control signal such that, when the SRAM cell stores bit '1', the second inserted NMOS transistor is operatively coupled to provide low leakage currents and when the SRAM cell stores bit '0', the first inserted NMOS transistor is operatively coupled to provide low leakage currents.

The virtual power supply voltage Vdd-Vth of the SRAM array is a voltage level obtained by lowering a power supply voltage Vdd by a threshold voltage Vth of a transistor. The first control signal and the second control signal are activated, when the SRAM cell operates in an active mode. The second control signal is a power supply voltage Vdd. The bit line and the complementary bit line are charged at a power supply voltage Vdd for reducing the gate and sub-threshold leakage currents. The bit line and the complementary bit line can also be pre-charged to the virtual power supply voltage Vdd-Vth for reducing bit-line leakage currents.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1A:
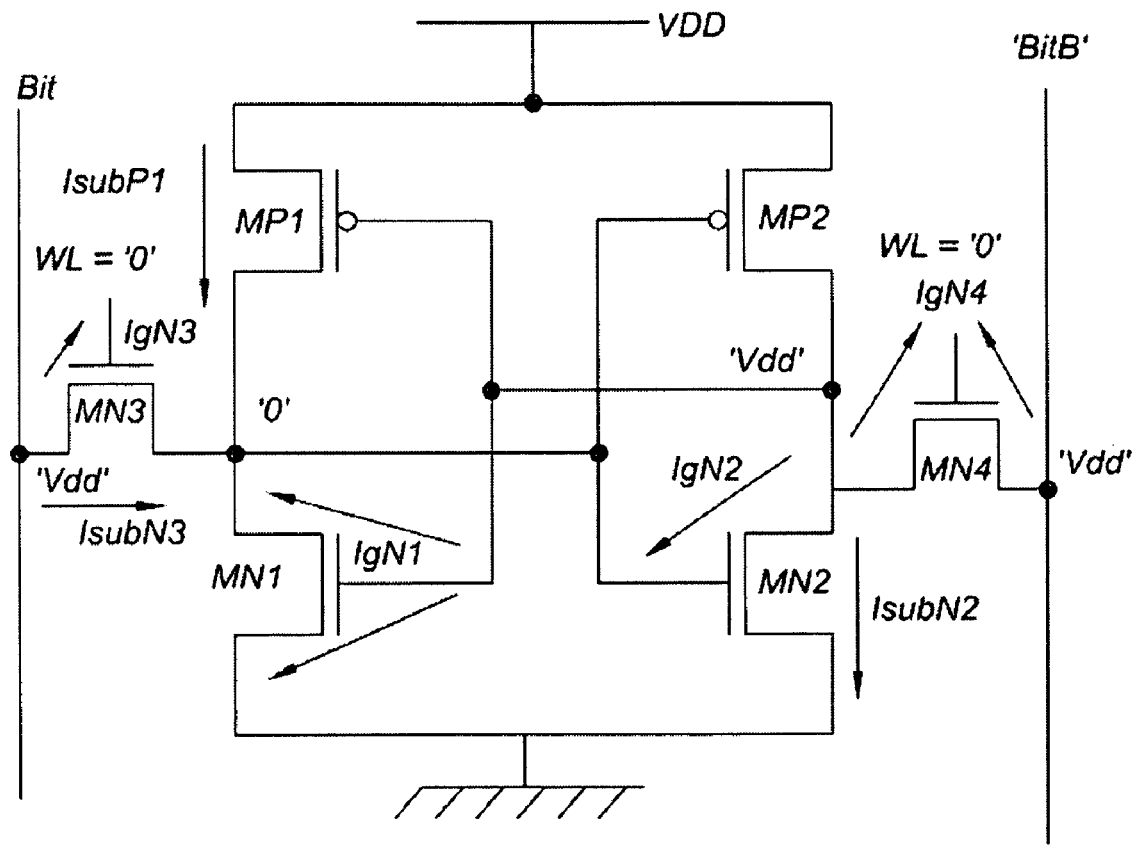
FIG. 1A illustrates a conventional low leakage current 6-T SRAM cell.
Figure 1B:
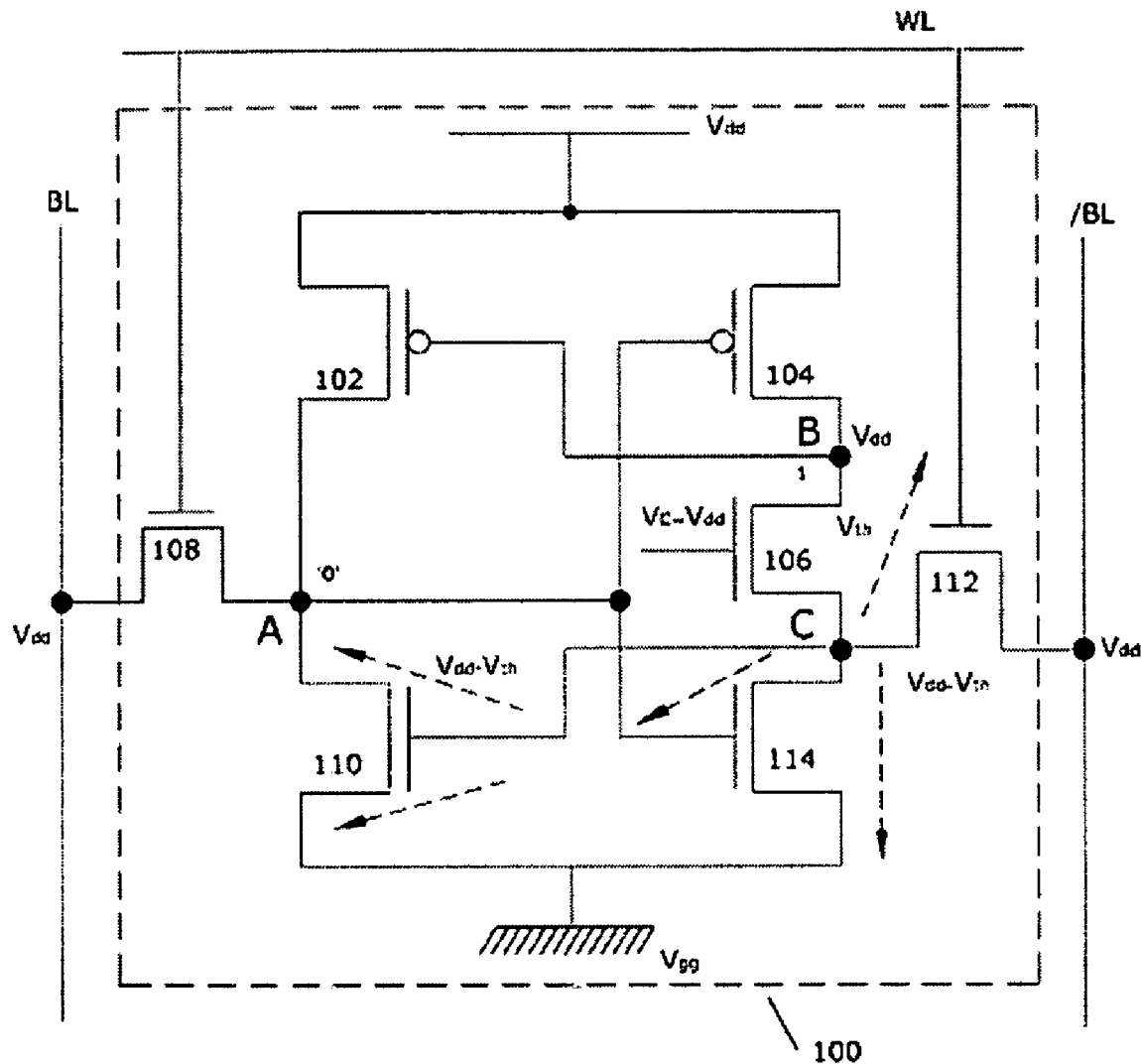
FIG. 1B illustrates a conventional low leakage current 7-T SRAM cell.
Figure 2:
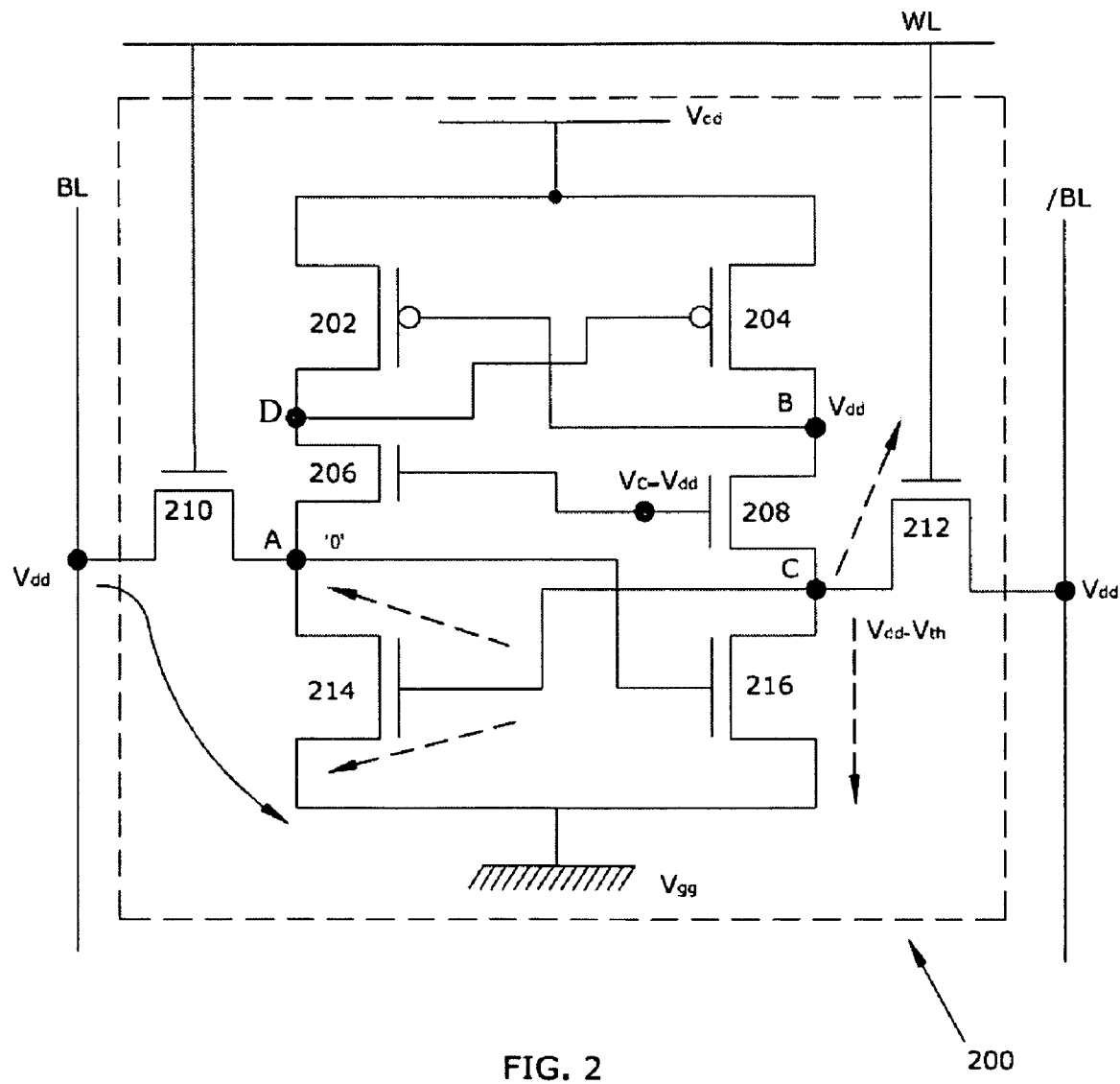
FIG. 2 is a circuit diagram of an SRAM cell according to an embodiment of the present invention.

FIG. 2 shows a circuit diagram of an SRAM cell (200) according to an embodiment of the present invention. The 8-T SRAM cell (200) includes eight operatively coupled transistors for providing low gate and sub-threshold leakage currents in the SRAM cell (200). The 8-T SRAM cell (200) receives an input voltage signal Vdd, and is connected to a bit line (BL)/complementary bit line (/BL), and a word line (WL) for read, write or erase operations. The 8-T SRAM cell (200) is designed to minimize the sub-threshold and gate leakage currents under various conditions. The SRAM cell (200) is designed to reduce leakage currents irrespective of data stored in the SRAM cell (200). Transistors are operatively coupled in the SRAM cell (200) to lower the effective supply voltage at different nodes, when either bit '0' or '1' is stored in the SRAM cell (200). The reduced effective supply voltage is passed to other coupled transistors for minimizing leakages. The lower effective supply voltage provides low leakage currents within the SRAM cell.

The SRAM cell 200 includes a first PMOS transistor (202), a second PMOS transistor (204), a first inserted NMOS transistor (208), a second inserted NMOS transistor (206), a third NMOS transistor (210), a first NMOS transistor (214), a second NMOS transistor (216), and a fourth NMOS transistor (212). The transistors are operatively coupled to each other for providing low leakage currents as shown in FIG. 2. The first PMOS transistor (202) has a source connected to a power supply voltage Vdd, a gate connected to a first control signal at node B, and a drain connected to a virtual power supply voltage at a node D. The virtual power supply voltage is obtained by lowering a power supply voltage Vdd by a threshold voltage (Vth) of a transistor. The second PMOS transistor (204) has a source connected to the power supply voltage Vdd, a gate connected to the virtual power supply voltage at node D, and a drain connected to the first control signal at node B. The first inserted NMOS transistor (208) has a source connected to the first control signal at node B, a gate connected to a second control signal Vc, and a drain connected to the virtual power supply voltage at node C. The second control signal Vc is kept at the supply voltage Vdd. The second inserted NMOS transistor (206) has a source connected to the virtual power supply voltage, a gate connected to the second control signal at Vc, which is kept at the supply voltage Vdd, and a drain connected to the virtual power supply voltage at node A. The third NMOS transistor (210) has a source, and has a gate connected to a word line WL, and a drain connected to the virtual power supply voltage at node A. The first NMOS transistor (214) has a source and a gate connected to the virtual power supply voltage at node A and C respectively, and a drain connected to a ground voltage Vgg. The second NMOS transistor (216) has a source and a gate connected to the virtual power supply voltage at node C and A respectively, and a drain connected to the ground voltage Vgg. The fourth NMOS transistor (212) has a source connected to the virtual power supply voltage at node C, a drain, and a gate connected to the word line WL.

The first inserted NMOS transistor (208) is operatively coupled in the 8-T SRAM cell (200) to provide suppressed gate and sub-threshold leakage currents when bit '0' is stored in the SRAM cell (200). Under this condition, the gate voltage of the first inserted NMOS transistor (208) is kept at power supply voltage Vdd. The first inserted NMOS transistor (208) will pass the gate voltage Vdd as Vdd-Vth (Vth is the threshold voltage of the inserted NMOS transistor 208) to node C and node C is connected to the second NMOS transistor (216). The gate voltage of the first NMOS transistor (214) is also reduced to Vdd-Vth, which reduces the gate leakage currents through the first NMOS transistor (214) as shown by dotted lines.

The second inserted NMOS transistor (206) is operatively coupled in the 8-T SRAM cell (200) to provide suppressed gate and sub-threshold leakage currents when bit '1' is stored in the SRAM cell (200). Under this condition, the gate of the second inserted NMOS transistor (206) is kept at voltage Vdd. The second inserted NMOS transistor (206) will pass this gate voltage Vdd as Vdd-Vth to the first NMOS transistor (214) through node A. Also the gate voltage to the second NMOS transistor (216) is reduced to Vdd-Vth, which significantly reduces the gate leakage currents in the second NMOS transistor (216). The 8-T SRAM cell (200) operates in the active mode, so the gate signal of the second inserted NMOS transistor (206) and the first inserted NMOS transistor (208) are activated. The bit-line (BL) and the complementary bit line (/BL) are charged at the power supply voltage Vdd for minimizing gate and sub-threshold leakages.

The SRAM cell (200) can be read and written to by means of bit lines and word lines. The nodes A and C are connected to a bit line BL and a complementary bit line /BL, respectively, via the third NMOS transistors (210) and the fourth NMOS transistor (212), respectively. The NMOS transistors (210) and (212) are referred to as access transistors or pass transistors. Gates of the third NMOS transistors (210) and the fourth NMOS transistor (212) are connected to the word line (WL) that enables reading and writing operations. If the node A is logic low and the word line WL is enabled to a logic high level, a current path from the bit line BL to the ground voltage Vgg via the pass transistor (210) and the first NMOS transistor (214) is formed, and the logic low state of the node A is read out to the bit line BL. If the node A is logic low and the word line WL is logic low, a leakage current path from the bit line BL to the ground voltage Vgg via the pass transistor (210) and the transistor (214) is formed in the SRAM cell (200).

Figure 3:
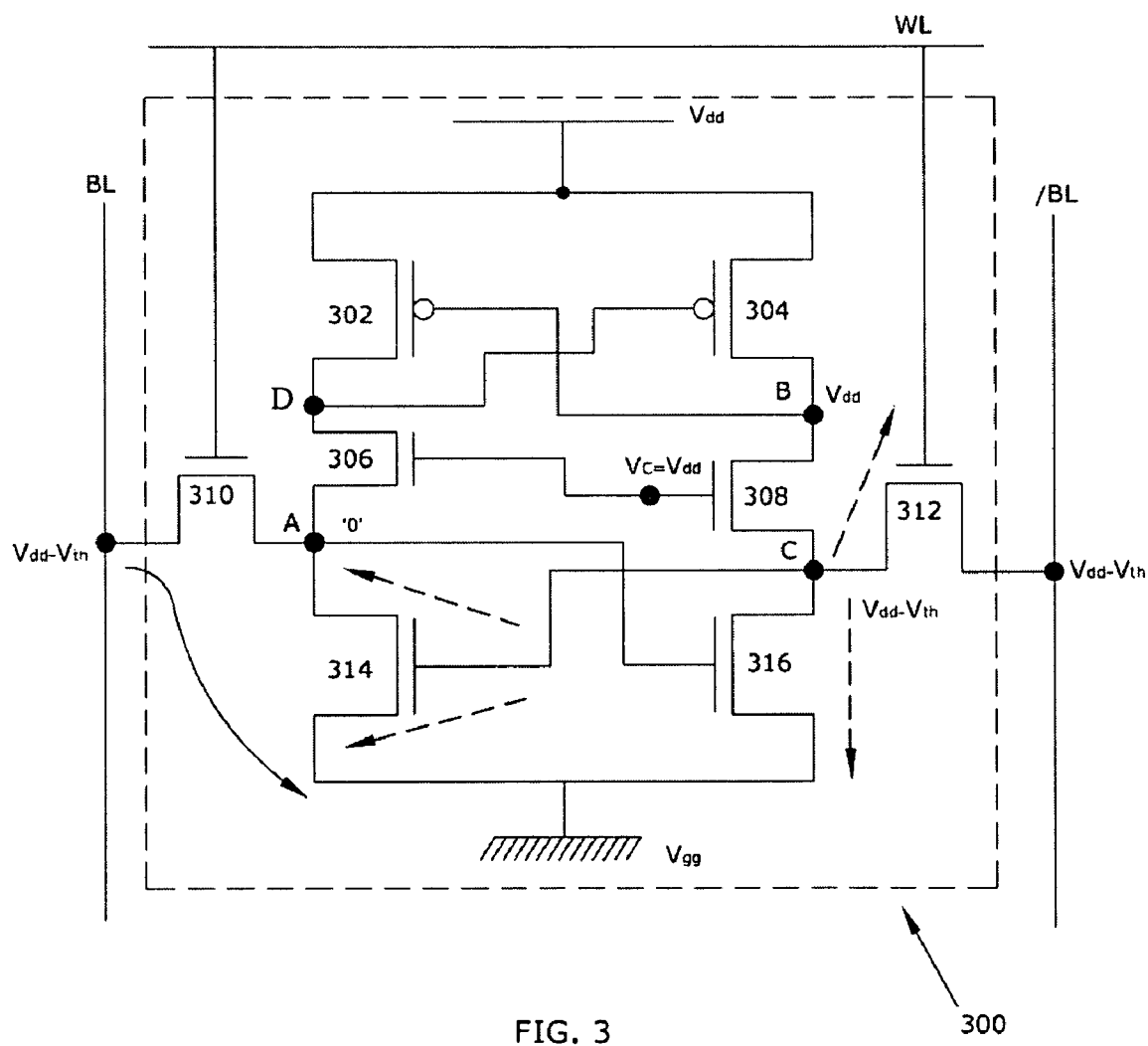
FIG. 3 is a circuit diagram of an SRAM cell according to an alternative embodiment of the present invention.

FIG. 3 is a circuit diagram of an SRAM cell (300) for controlling bit-line leakage currents according to an alternative embodiment of the present invention. The SRAM cell (300) receives an input voltage signal Vdd, and is connected to a bit line (BL)/complementary bit line (/BL), and a word line (WL). The bit-line (BL) and the complementary bit-line (/BL) of the SRAM cell (300) can be pre-charged to a voltage of Vdd-Vth to reduce the bit line leakage current.

Figure 4:
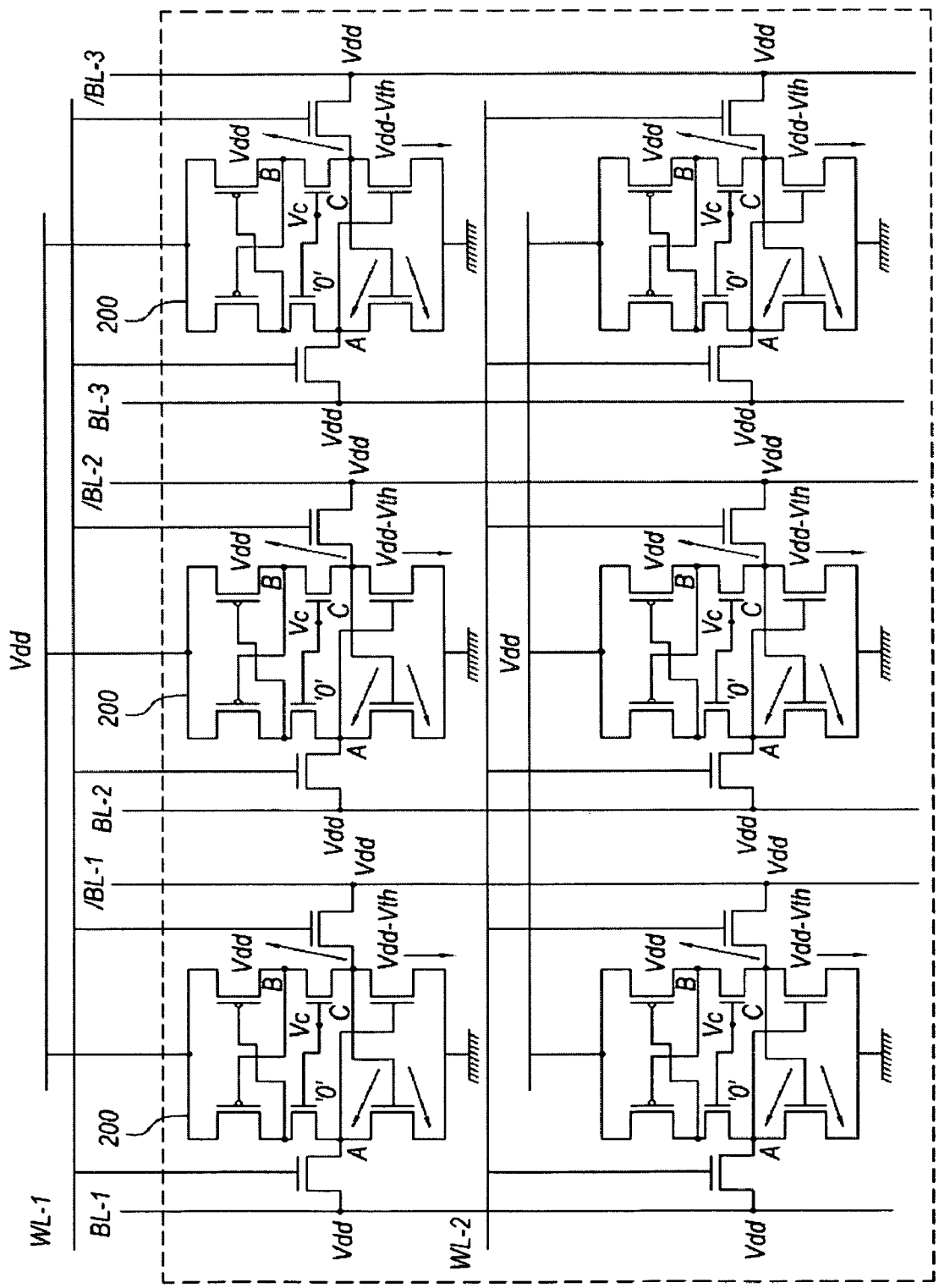
FIG. 4 is a circuit diagram of an SRAM array according to an embodiment of the present invention.

FIG. 4 shows an SRAM array (400) that provides reduced leakage currents. The SRAM array (400) consists of 2 rows and 3 columns (2×3 matrix) as shown merely for illustration purposes, and typically the array would include many more rows and columns of SRAM cells (200/300). The SRAM array (400) includes a plurality of SRAM cells (200/300), each SRAM cell in a row connected to a word line, and SRAM cells in a column connected to a bit line, a complementary bit line, a power supply voltage, and a ground voltage. The SRAM cell (200/300) in each row is connected to a common word-line (either WL1 or WL2) and to different bit-lines (BL1/BL2/BL3) and complementary bit-line (/BL1, /BL2, /BL3) for each cell. The cells (200/300) in a column share a common bit-line and complementary bit-line with each cell in a column connected to a different word-line (WL-1/WL-2). The detailed description of the SRAM cells (200/300) is explained in FIGS. 2 and 3.

Embodiments of the present invention can be utilized in a variety of different types of electronic devices, such as cellular telephones, personal digital assistants, and other types of telecommunications and networking devices, as well as other types of electronic devices like computer systems.

From the foregoing it will be appreciated that, although specific embodiments of the invention have been described herein for purposes of illustration, various modifications may be made without deviating from the spirit and scope of the invention.

I claim:

1. An SRAM cell for providing low leakage current comprising:

a first PMOS transistor having a source connected to a power supply voltage node, a gate connected to a first control signal node, and a drain connected to a first virtual power supply voltage node;

a second PMOS transistor having a source connected to the power supply voltage node, a gate connected to the first virtual power supply voltage node and a drain connected to the first control signal node;

a first inserted NMOS transistor having a source connected to the first control signal node, a gate connected to a second control signal node, and a drain connected to a second virtual power supply voltage node;

a third NMOS transistor having a source, and a gate connected to a word line, and a drain connected to a third virtual power supply voltage node;

a first NMOS transistor having a source connected to the third virtual power supply voltage node, a gate connected to the second virtual power supply voltage node, and a drain connected to a ground voltage node;

a second NMOS transistor having a source connected to the second virtual power supply voltage node, and a gate connected to the third virtual power supply voltage node, and a drain connected to the ground voltage node; and a fourth NMOS transistor having a source connected to the second virtual power supply voltage node, a drain, and a gate connected to the word line, wherein a second inserted NMOS transistor having a source connected to the first virtual power supply voltage node, and a drain connected to the third virtual power supply voltage node, and a gate connected to the second control signal node such that, when the SRAM cell stores bit '1', the second inserted NMOS transistor is operatively coupled to provide low leakage currents and when the SRAM cell stores bit '0', the first inserted NMOS transistor is operatively coupled to provide low leakage currents.

2. The SRAM cell as claimed in claim 1, wherein said virtual power supply voltage is a voltage level obtained by lowering a power supply voltage by a threshold voltage of a transistor.

3. The SRAM cell as claimed in claim 1, wherein said first control signal and said second control signal are activated, when said SRAM cell is operating in an active mode.

4. The SRAM cell as claimed in claim 1, wherein said second control signal is a power supply voltage.

5. The SRAM cell as claimed in claim 1, wherein said bit line and said complementary bit line are charged at a power supply voltage.

6. The SRAM cell as claimed in claim 1, wherein said bit line and said complementary bit line are precharged to said virtual power supply voltage for reducing a bit-line leakage current.

7. An SRAM array for providing low leakage current comprising:
a plurality of SRAM cells, each of said SRAM cell connected to a word line in a row and in a column to a bit line, a complementary bit line, a power supply voltage, and a ground voltage, wherein each of said SRAM cell comprising:
a first PMOS transistor having a source connected to a power supply voltage node, a gate connected to a first control signal node, and a drain connected to a first virtual power supply voltage node;
a second PMOS transistor having a source connected to the power supply voltage node, a gate connected to the first virtual power supply voltage node and a drain connected to the first control signal node;
a first inserted NMOS transistor having a source connected to the first control signal node, a gate connected to a second control signal node, and a drain connected to a second virtual power supply voltage;
a third NMOS transistor having a source connected to the corresponding bit line, and a gate connected to the corresponding word line, and a drain connected to a third virtual power supply voltage node;
a first NMOS transistor having a source connected to the third virtual power supply voltage node, a gate connected to the second virtual power supply voltage node, and a drain connected to a ground voltage node;
a second NMOS transistor having a source connected to the second virtual power supply node, and a gate connected to the third virtual power supply voltage node, and a drain connected to the ground voltage node; and
a fourth NMOS transistor having a source connected to the second virtual power supply voltage node, a drain connected to the corresponding complementary bit line, and a gate connected to the corresponding word line,
wherein a second inserted NMOS transistor having a source connected to the first virtual power supply voltage node, and a drain connected to the third virtual power supply voltage node, and a gate connected to the second control signal node such that, when the SRAM cell stores bit '1', the second inserted NMOS transistor is operatively coupled to provide low leakage currents and when the SRAM cell stores bit '0', the first inserted NMOS transistor is operatively coupled to provide low leakage currents.

8. The SRAM array as claimed in claim 7, wherein said virtual power supply voltage is a voltage level obtained by lowering said power supply voltage by a threshold voltage of a transistor.

9. The SRAM array as claimed in claim 7, wherein said first control signal and said second control signal are activated, when said SRAM cell is operating in an active mode.

10. The SRAM array as claimed in claim 7, wherein said second control signal is a power supply voltage.

11. The SRAM array as claimed in claim 7, wherein said bit line and said complementary bit line are charged at a power supply voltage.

12. The SRAM array as claimed in claim 7, wherein said bit line and said complementary bit line are precharged to said virtual power supply voltage for reducing a bit-line leakage current.

* * * * *